United States Patent [19]
Nashimoto

[11] Patent Number: 5,514,484
[45] Date of Patent: May 7, 1996

[54] ORIENTED FERROELECTRIC THIN FILM

[75] Inventor: Keiichi Nashimoto, Kanagawa, Japan

[73] Assignee: Fuji Xerox Co., Ltd., Tokyo, Japan

[21] Appl. No.: 137,794

[22] Filed: Oct. 19, 1993

[30] Foreign Application Priority Data

Nov. 5, 1992 [JP] Japan .................................. 4-319228
Nov. 5, 1992 [JP] Japan .................................. 4-319229

[51] Int. Cl.⁶ .................................................. B32B 18/00
[52] U.S. Cl. ......................... 428/700; 428/446; 428/701; 428/702; 505/191; 505/873; 257/613; 117/948; 117/949; 365/145
[58] Field of Search .................................. 505/235, 191, 505/701, 703, 873; 257/78, 77, 613; 117/918, 948, 949; 428/697, 699, 700, 701, 702; 365/145

[56] References Cited

U.S. PATENT DOCUMENTS

| | | | |
|---|---|---|---|
| 3,962,027 | 6/1976 | Bruton | 117/949 |
| 4,942,142 | 7/1990 | Itozaki | 505/701 |
| 5,061,687 | 10/1991 | Takada | 428/700 |
| 5,212,620 | 3/1993 | Evans, Jr. | 365/145 |
| 5,323,023 | 6/1994 | Fork | 505/235 |
| 5,418,216 | 5/1995 | Fork | 505/473 |

FOREIGN PATENT DOCUMENTS 61-185808  8/1986  Japan.

OTHER PUBLICATIONS

"Epitaxial MgO on Si(001) for Y–Ba–Cu–O thin–film growth by pulsed laser deposition", Fork et al., Appl. Phys. Lett., vol. 58, No. 20, pp. 2294–2296, May 1991.

"Growth of ceramic thin films on Si(100) using an in situ laser deposition technique", Tiwari et al., J. Appl. Phys., vol. 69, No. 12, pp. 8358–8362, Jun. 1991.

Primary Examiner—Ellis P. Robinson
Assistant Examiner—Timothy M. Speer
Attorney, Agent, or Firm—Finnegan, Henderson, Farabow, Garrett & Dunner

[57] ABSTRACT

An orientative ferroelectric thin film has such a structure that an epitaxial or orientative buffer layer having a double layer structure constituted by two layers is formed on a semiconductor single crystal (100) substrate, and an epitaxial or orientative perovskite $ABO_3$ type ferroelectric thin film is further formed on the buffer layer. The epitaxial or orientative buffer layer has a structure in which a perovskite $ABO_3$ type thin film is formed on an MgO thin film. Also, an orientative ferroelectric thin film has such a structure that an opitaxial MgO buffer layer is formed on a single crystal Si (100) substrate, and an epitaxial or orientative perovskite $ABO_3$ type ferroelectric thin film is formed on the buffer layer.

9 Claims, 3 Drawing Sheets

ORIENTED FERROELECTRIC THIN FILM

BACKGROUND OF THE INVENTION

The present invention relates to an orientative ferroelectric thin film which can be used in the case of making up a non-volatile memory, a capacitor, an optical modulation element or the like on a semiconductor substrate.

Conventionally, owing to various properties of a ferroelectric substance such as a ferro-electric property, a piezoelectric property, a pyro-electric property and an electro-optic effect, an oxide ferroelectric thin film has been expected to be applied not only to a non-volatile memory but also to various devices such as a surface elastic wave element, an infrared ray pyro-electric element, an acoustic optical element, an electro-optic element. Of these applications, in order to realize low light loss in a thin film optical waveguide structure and to obtain polarization property or electro-optic effect comparable to a single crystal, it is inevitable to make up a single crystal thin film. Therefore, a number of attempts have been made to make up an epitaxial ferroelectric thin film of $BaTiO_3$, $PbTiO_3$, $Pb_{1-x}La_x(Zr_{1-y}Ti_y)_{1-x/4}O_3$ (PLZT) where $0 \leq x$, $y \leq 1$, $LiNbO_3$, $KNbO_3$, $Bi_4Ti_3O_{12}$ or the like on an oxide single crystal substrate by such a method as Rf-magnetron sputtering, ion beam sputtering, laser ablation or organo-metal chemical vapor deposition (MOCVD).

However, in order to achieve integration with semiconductor elements, it is necessary to make up a ferroelectric thin film on a semiconductor substrate. However, it is difficult to attain the epitaxial growth of a ferroelectric thin film on a semiconductor substrate such as a Si substrate, because of high temperature in the growth, mutual diffusion between a semiconductor and a ferroelectric substance, the oxidation of the semiconductor and so on. Also, the epitaxial growth of a ferroelectric thin film onto a GaAs substrate is difficult for the following reasons. That is, GaAs is known as a substance in which As of the surface is reduced at 400° C. or more, and with no $As_4$ atmosphere, As and Ga begin to be sublimated for each layer at 690° C. or more. Although reports about making up a ferroelectric thin film onto a GaAs substrate, are extremely few in number, it is known that the diffusion of Pb to GaAs is detected when PLZT has grown up on a GaAs substrate.

For these reasons, it is necessary to form a capping layer as a buffer layer on a semiconductor substrate so that the capping layer helps the epitaxial growth of a ferroelectric thin film and acts as a diffusion barrier. Further, if such a buffer layer is provided in an FET element in which an insulator is formed between a ferroelectric substance and a semiconductor, it is possible to prevent charges from being injected from the semiconductor at the time of the polarization of the ferroelectric substance, so that it is easy to maintain the polarization state of the ferroelectric substance. A ferroelectric substance generally has a smaller refractive index than Si and GaAs. If a buffer layer having a refractive index smaller than a ferroelectric substance can be obtained, it is possible to confine semiconductor laser light in a ferroelectric thin film optical waveguide, so that it is possible to make up an optical modulation element on a semiconductor laser or to produce an optical integrated circuit on an Si semiconductor integrated circuit.

On the other hand, Japanese Patent Unexamined Publication No. Sho-61-185808 discloses a technique in which a ferroelectric compound is grown up epitaxially on a substrate in which $MgAl_2O_4$ (100) or MgO (100) has been grown up epitaxially as a buffer layer on an Si (100) single crystal. However, as shown in the following Table 1, the lattice constants of $MgAl_2O_4$ and MgO are 8.083 angstrom (½ is 4.042), and 4.213 angstrom respectively, so that it has been difficult to epitaxially grow up a typical ferroelectric substances such as $PbTiO_3$ (lattice constant a=3.899 angstrom, c=4.153 angstrom), $BaTiO_3$ (lattice constant a=3.994 angstrom, c=4.038 angstrom) in c-axis orientation on the above-mentioned $MgAl_2O_4$ or MgO since the lattice constant of each of $MgAl_2O_4$ and MgO is closer to the lattice constant of the c-axis of the ferroelectric substance than to that of the a-axis, or shows a value between the lattice constants of the both axes. Therefore, if $PiTiO_3$, $BaTiO_3$ or the like is grown up on epitaxial $MgAl_2O_4$ (100) or MgO (100) on an Si (100) single crystal substrate, it has been possible to obtain only an orientation film in which the (100) plane and (001) plane of such a ferroelectric substance are mixed with each other and orientated in parallel to the substrate, that is, a-axis orientation and c-axis orientation crystal grains are mixed.

Table 1 shows the lattice constants of $SrTiO_3$, $MgAl_2O_4$ and MgO as buffer layer and $PbTiO_3$ and $BaTiO_3$ as ferroelectric substance, and the relationship of lattice mismatching degree between them.

TABLE 1

| crystal | structure | structure | lattice constant (Å) | $BaTiO_3$ a (Å) 3.994 | $BaTiO_3$ c (Å) 4.038 | $PbTiO_3$ a (Å) 3.889 | $PbTiO_3$ c (Å) 4.153 |
|---|---|---|---|---|---|---|---|
| $SrTiO_3$ | perovskite | cubic | 3.905 | 2.3% | 3.4% | −0.2% | 6.4% |
| $MgAl_2O_4$ | spinal | cubic | 8.083 (½ = 4.042) | −1.2% | −0.1% | −3.5% | 2.8% |
| MgO | NaCl | cubic | 4.213 | −5.2% | −4.2% | −7.5% | −1.4% |

Further, in the above mentioned Japanese Patent Unexamined Publication No. Sho-61-185808, the crystallographic relationship between the Si (100) single crystal and the MgO (100) was not shown obviously therein. In fact, according to the study after that, it was made clear that MgO was an orientative poly-crystal MgO having a random intra-surface orientation although its (100) plane was parallel to the Si (100) plane (P. Tiwari et al., J. Appl. Phys. 69, 8358 (1991)).

After that, it was turned out for the first time that MgO which was often used as a substrate of a ferroelectric substance or a high temperature superconductor because of its lattice constant and thermal stability, could be grown up epitaxially on Si (D. K. Fork et al., Appl. Phys. Lett. 58, 2294 (1991)), and there has been proposed a superconductor thin film using this fact.

However, as described above, it has been difficult in the prior art to form an epitaxial or orientative ferroelectric thin film of c-axis orientation on a semiconductor substrate. Further, it has been difficult in the prior art to grow up a ferroelectric thin film on a single crystal Si substrate epitaxially.

SUMMARY OF THE INVENTION

It is therefore an object of the present invention to solve the problems. That is, it is an object of the present invention to provide an orientative ferroelectric thin film in which an epitaxial or orientative ferroelectric thin film is formed on a semiconductor single crystal (100) substrate. It is another object of the present invention to provide an orientative ferroelectric thin film which can be used in the case of making up a non-volatile memory or capacitor having a high function, an optical modulation element or the like on a semiconductor substrate.

As a result of further investigation about the abovementioned technique to epitaxially grow up MgO on a semiconductor (100) substrate, the present inventor found that a perovskite $ABO_3$ type thin film, the lattice constant of which is closer to the lattice constant of the a-axis of $PbTiO_3$, $BaTiO_3$ or the like than to that of the c-axis thereof, for example, a $SrTiO_3$ film, the lattice constant of which is 3.905 angstrom as shown in the above Table 1, is brought into (100) epitaxial growth, so that the a-axis of a ferroelectric thin film of $PbTiO_3$, $BaTiO_3$ or the like can match with the lattice constant of the $SrTiO_3$ film in priority, and the ferroelectric thin film can be brought into (001) epitaxial growth of c-axis orientation.

That is, according to a first aspect of the present invention, the orientative ferroelectric thin film is characterized in that an epitaxial or orientative buffer layer having a double-layer structure is formed on a thin film semiconductor single crystal (100) substrate, and an epitaxial or orientative perovskite $ABO_3$ type ferroelectric thin film is further formed on the buffer layer. The epitaxial or orientative buffer layer has a structure in which a perovskite $ABO_3$ type thin film is formed on an MgO thin film. Further, a perovskite $ABO_3$ type thin film constituting the epitaxial or orientative buffer layer has a lattice constant closer to the a-axis of the perovskite $ABO_3$ type ferroelectric thin film as an upper layer than to the c-axis thereof. The crystallographic relationship among the single crystal substrate, the buffer layer and the perovskite $ABO_3$ type ferroelectric thin film is expressed by $ABO_3$ (001)//$SrTiO_3$ (100)//MgO (100)//semiconductor single crystal (100).

Furthermore, the present inventor found that a ferroelectric thin film can be grown up epitaxially on an Si (100) substrate by growing MgO epitaxially on an Si (100) substrate by a vapor phase growth method and using the MgO as a buffer layer.

That is, an orientative ferroelectric thin film according to a second aspect of the present invention is characterized in that an epitaxial MgO buffer layer is formed on a single crystal Si (100) substrate, and an epitaxial or orientative perovskite $ABO_3$ type ferroelectric thin film is further formed on the buffer layer.

DETAILED DESCRIPTION OF THE PREFERRED EMBODMENTS

Figure 1:
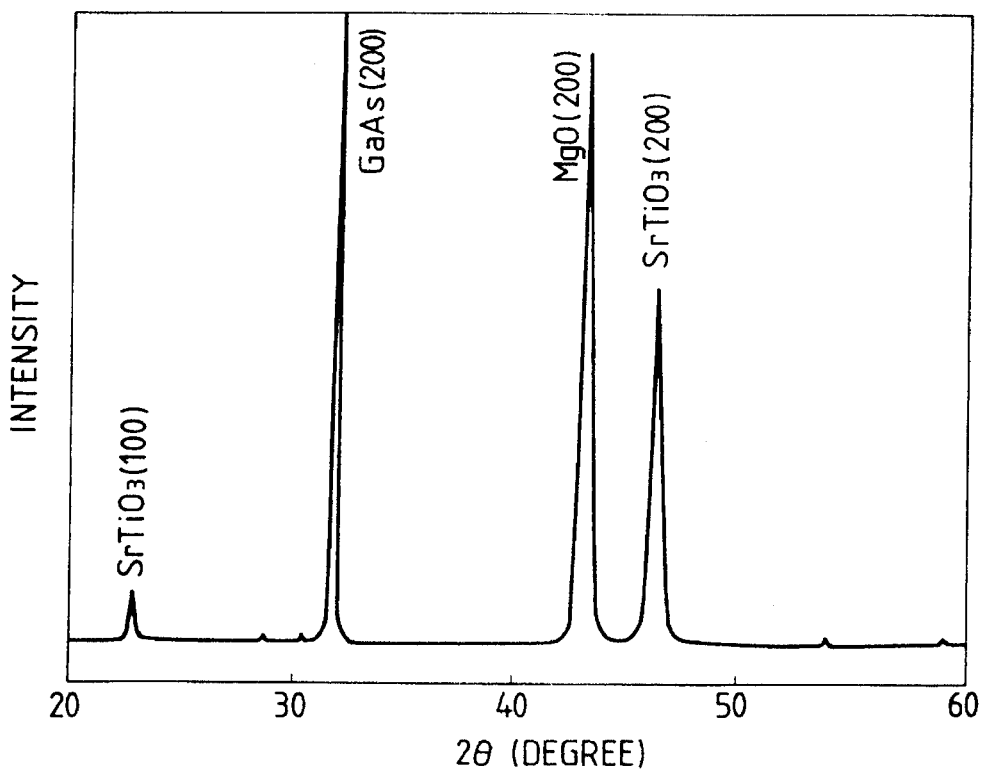
FIG. 1 is an X-ray diffractive diagram of an $SrTiO_3$/MgO double-layer thin film on a single crystal GaAs substrate.

Preferred embodiments of the present invention will now be described with reference to the accompanying drawings.

According to a first embodiment of the present invention, an orientative ferroelectric thin film is characterized in that an epitaxial or orientative buffer layer having a double-layer structure is formed on a thin film semiconductor single crystal (100) substrate, and an epitaxial or orientative perovskite $ABO_3$ type ferroelectric thin film is further formed on the buffer layer.

In the first embodiment, the semiconductor single crystal (100) substrate uses a semiconductor single crystal (100) selected from simplex semiconductors such as Si, Ge or Si diamond, selected from Group III-V compound semiconductors such as AlAs, AlSb, AlP, GaAs, GaSb, InP, InAs, InSb, AlGaP, AlLnP, AlGaAs, AlInAs, AlAsSb, GaInAs, GaInSb, GaAsSb or InAsSb, or selected from Group II-VI compound semiconductors such as ZnS, ZnSe, ZnTe, CdSe, CdTe, HgSe, HgTe or CdS.

An epitaxial or orientative buffer layer having a double-layer structure is formed on the semiconductor single crystal (100) substrate. Specifically, a (100) epitaxial or orientative MgO buffer layer is formed, and a (100) epitaxial or or orientative perovskite $ABO_3$ type thin film buffer layer is further formed thereon. The perovskite $ABO_3$ type thin film buffer layer is preferably $SrTiO_3$ and has a lattice constant closer to that of the a-axis of a perovskite $ABO_3$ type ferroelectric thin film as an upper layer than to that of the c-axis.

The above-mentioned MgO and perovskite $ABO_3$ type thin film buffer layer may be made up by a wet process such as a sol-gel process or a vapor phase growth process selected from electron beam evaporation, flash evaporation, ion plating, Rf-magnetron sputtering, ion beam sputtering, laser ablation, molecular beam epitaxy (MBE), chemical vapor deposition (CVD), plasma CVD, organo-metal chemical vapor deposition (MOCVD), etc.

A (001) epitaxial or orientative perovskite $ABO_3$ type ferroelectric thin film of c-axis orientation is further formed on the above-mentioned buffer layer. Specifically, a ferroelectric thin film of $BaTiO_3$, $PbTiO_3$, $Pb_{1-x}La_x(Zr_{1-y}Ti_y)_{1-x/4}O_3$ (PLZT) where $0 \leq x,y \leq 1$, $LiNbO_3$, $KNbO_3$, $Bi_4Ti_3O_{12}$, or the like is formed. As the method of producing it, a method similar to that described on the production of the buffer layer may be employed.

The crystallographic relationship among the single crystal substrate, the buffer layer and the perovskite $ABO_3$ type ferroelectric thin film is, for example, expressed by $ABO_3$ (001)//$ABO_3$ (100)//MgO (100)//semiconductor single crystal (100). For example, the crystallographic relationship in an orientative ferroelectric thin film in which a $BaTiO_3$ ferroelectric thin film and a buffer layer of a double-layer structure consisting of MgO and SrTiO$_3$ are formed on GaAs, is expressed by BaTiO$_3$ (001)//SrTiO$_3$ (100)//MgO (100)//GaAs (100), and intra-surface orientation BaTiO$_3$ [010]//SrTiO$_3$ [001]//MgO [001]//GaAs [001], making such a structure that the polarization direction of a ferroelectric substance of square crystal system is perpendicular to the surface of the substrate.

Since the orientative ferroelectric thin film according to the first embodiment of the present invention has such a structure as mentioned above, the c-axis orientation growth of a perovskite ABO$_3$ type ferroelectric thin film on a single crystal semiconductor (100) substrate can be realized by a buffer layer which helps the epitaxial growth of the ferroelectric thin film, and also acts as a diffusion barrier.

Further, since the orientation of a ferroelectric thin film can be controlled, it is possible to obtain a large value of residual polarization or a large electro-optic constant. In an FET element in which an insulator is formed between a ferroelectric substance and a semiconductor, it is possible to prevent charges from being injected from the semiconductor at the time of the polarization of the ferroelectric substance, so that it is easy to maintain the polarization state of the ferroelectric substance. Further, although the refractive index of a ferroelectric substance is generally smaller than that of a semiconductor, an MgO layer having a refractive index smaller than the ferroelectric substance enables semiconductor laser light to be confined in a ferroelectric thin film optical waveguide, so that it is possible to make up an optical modulation element on a GaAs group semiconductor laser or produce an optical integrated circuit on an Si semiconductor integrated circuit.

Specific examples of the first embodiment will now be described.

EXAMPLE 1

The formation of an epitaxial layer onto a GaAs substrate was performed by excimer laser deposition in which a target surface is momentarily heated by UV laser pulses to perform deposition. An XeCl excimer laser (wavelength 308 nm) was used under the conditions of pulse period 4 Hz, pulse length 17 ns, and energy 130 mJ (energy density on the target surface 1.3 J/cm$^2$). The distance between the target and the substrate was 50 mm. PbTiO$_3$ and SrTiO$_3$ were used as the target, and metal Mg was used since MgO has no absorption in wavelength 308 nm. Mg is easyly oxidized by loading O$_z$ into a film since MgO has a high bond energy not less than 10 eV. The substrate was heated by a halogen lamp.

An n-type (100)±0.2°, 6×6 mm wafer was used as the GaAs substrate (cubic crystal, zinc blende structure, a=5.653 angstrom). The substrate was etched in an H$_2$SO$_4$ group solution after solvent cleaning. This substrate was further rinsed with deionized water and ethanol, and was finally spin-dried with ethanol under the flow of nitrogen. Some reports say that a single-layer oxidized film on the surface of a GaAs substrate formed by rinsing with deionized water after etching, acts as a passivation layer, and dissociates at 582° C. Therefore, the substrate was led into a deposition chamber immediately after spin-drying, and was heated at a constant temperature under background pressure 3×10$^{-7}$ Torr in order to dissociate (sublimate) a passivation layer on the GaAs surface, and then the formation of a film of MgO of 40 to 400 angstrom was performed.

As a result of analysis by X-ray diffraction, MgO (cubic crystal, NaCl structure, a=4.213 angstrom) was formed into an epitaxial film of (100) plane single orientation under a broad condition. Particularly, a superior thin film was formed under the conditions of 250° to 450° C., and 5×10$^{-6}$ to 1×10$^{-4}$ Torr O$_2$. X-ray diffraction phi scanning was performed in order to identify the relationship of intra-surface crystal orientation between MgO and GaAs. The phi scanning on (202) plane having an angle 45° with respect to (100) plane in cubic crystal showed a sharp peak having a revolution cycle of 90° with respect to MgO of MgO (100)/CaAs (100), and this position was coincident with the peak position of GaAs. From this fact, it was understood that the crystallographic relationship between MgO and GaAs was expressed by MgO (100)//GaAs (100) in crystal orientation, and MgO [001]//GaAs [001] in intra-surface orientation in spite of the lattice mismatching degree of 25.5%.

According to the observation of the interface between MgO and GaAs by use of a high resolution transmission-type electronic microscope, a two-dimension superlattice was formed in the MgO-GaAs interface by the lattice matching of MgO:GaAs=4:3, and the interface had no production of secondary layer or the like and was a sharp boundary. Since the lattice matching degree is 0.7% in MgO:GaAs=4:3, it can be considered that the stress in the film was relaxed so that the epitaxial growth of MgO [001]//GaAs [001] was realized in spite of such a large degree of lattice mismatching.

Figure 2:
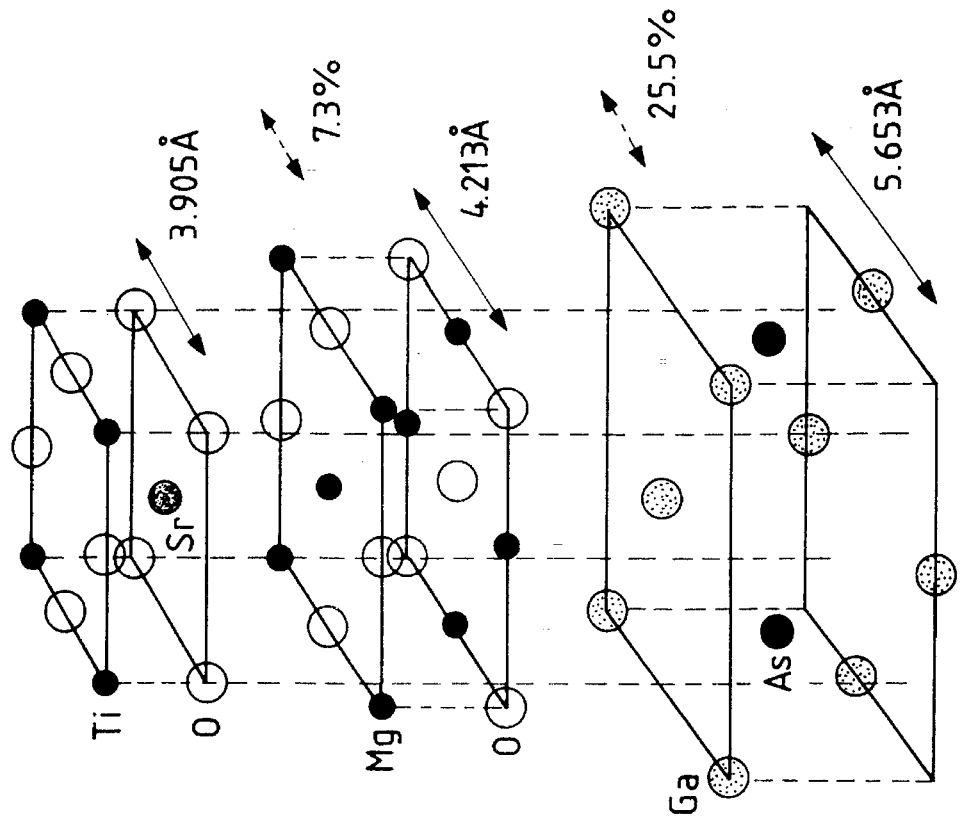
FIG. 2 is an explanatory diagram illustrating the relationship of crystal orientation of an epitaxial $SrTiO_3$ thin film and an MgO thin film to a single crystal GaAs substrate.
Figure 2:
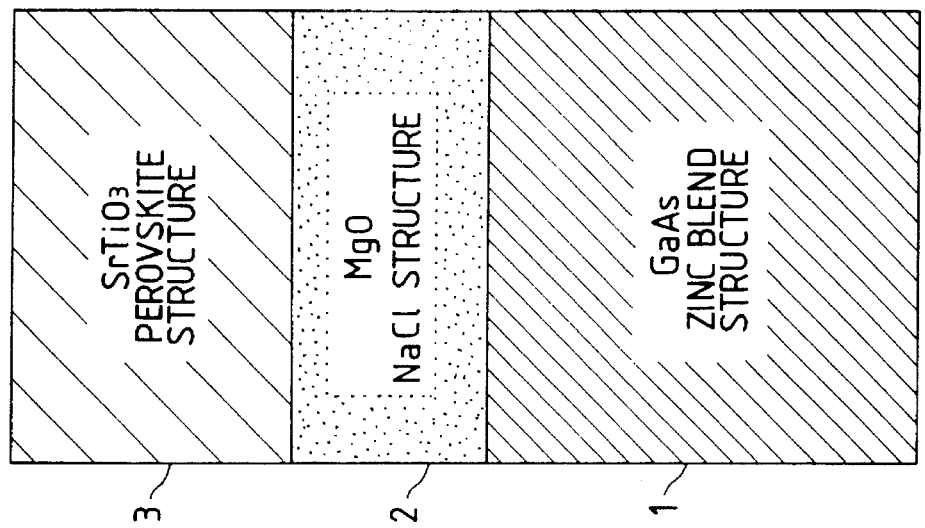

Further, under the conditions of 600° to 800° C., and 1×10$^{-4}$ to 1×10$^{-2}$ Torr O$_2$, SrTiO$_3$ (cubic crystal, perovskite structure, a=3.905 angstrom) of film thickness 200 to 1,000 angstrom grown up on the MgO buffer layer showed epitaxial growth in spite of the degree 7.3% of lattice mismatching to MgO. The relationship of crystal orientation between SrTiO$_3$ and MgO/GaAs identified by the X-ray diffraction pattern and phi scanning shown in FIG. 1, was SrTiO$_3$ (100)//MgO (100)//GaAs (100), and SrTiO$_3$ [001]// MgO [001]//GaAs [001] as shown in FIG. 2. In FIG. 2, reference numeral 1 represents a single crystal substrate (zinc blende structure) consisting of GaAs; 2, an MgO thin film (NaCl structure); and 3, an SrTiO$_3$ thin film (perovskite structure).

On the other hand, BaTiO$_3$ (square crystal, perovskite structure, a=3.994 angstrom, c=4.038 angstrom) of a typical ferroelectric substance and GaAs (cubic crystal, zinc blende structure, a=5.653 angstrom) are very different in lattice constant, but from the point of view of the intra-surface 45° revolution of BaTiO$_3$ (001) plane and GaAs (100) plane, that is, the relationship of orientation of BaTiO$_3$ [110]//GaAs [001], the degree of lattice mismatching is only 0.1%. Therefore, BaTiO$_3$ was first formed into a film directly on GaAs. A substrate temperature was 700° C. and the number of pulses was 2,500. After a film was formed in the region of O$_2$ pressure from a background pressure to 3×10$^{-2}$ Torr for the first 100 pulses, the formation of the film was continued at 1.2×10$^{-2}$ Torr O$_2$. The crystallization of BaTiO$_3$ was changed depending on the O$_2$ pressure acting for the first 100 pulses, and the strongest BaTiO$_3$ in XRD peak intensity was a film formed at 700° C. and 0.5×10$^{-3}$ Torr O$_2$, which was a polycrystal film of (110) or (101) orientation. As described above, epitaxy was not decided on the degree of lattice matching simply.

Although epitaxy was not seen in the direct growth of BaTiO$_3$ on GaAs as described above, all BaTiO$_3$ of film thickness 500 to 2,000 angstrom grown up on an SrTiO$_3$/ MgO buffer layer under the conditions of 600° to 800° C. and 1×10$^{-4}$ to 1×10$^{-2}$ Torr O$_2$ showed epitaxial growth. As a result of analysis in X-ray diffractive pattern, BaTiO$_3$ was perfect in c-axis orientation, and the relationship of crystal orientation between BaTiO$_3$ and SrTiO$_3$/MgO/GaAs identified by phi scanning was BaTiO$_3$ (001)//SrTiO$_3$ (100)//MgO (100)//GaAs (100), and BaTiO$_3$ [010]//SrTiO$_3$ [001]//MgO [001]//GaAs [001].

Figure 3:
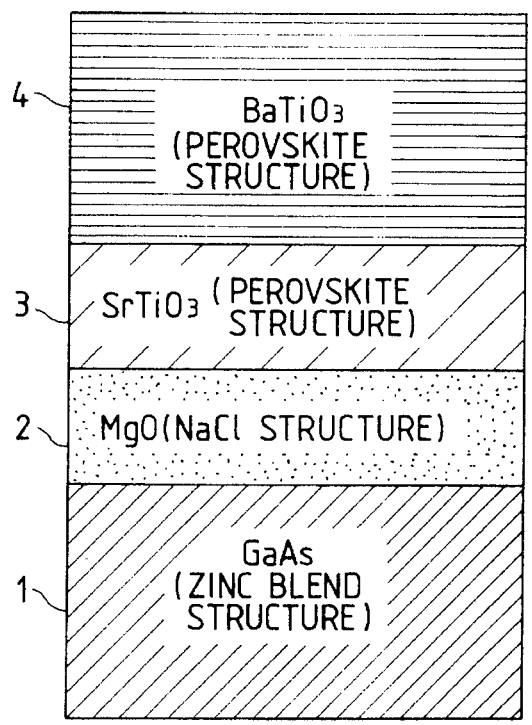
FIG. 3 is a model sectional diagram of a ferroelectric thin film of a first embodiment of the present invention constituted by a multi-layer structure of $BaTiO_3$/$SrTiO_3$/MgO/GaAs.

FIG. 3 is a model sectional view of a ferroelectric thin film having a multi-layer structure of BaTiO$_3$/SrTiO$_3$/MgO/GaAs made up in the above-mentioned manner, in which reference numeral 1 represents a single crystal substrate (zinc blende structure) consisting of GaAs; 2, an MgO thin film (NaCl structure); 3, an SrTiO$_3$ thin film (perovskite structure); and 4, a BaTiO$_3$ thin film (perovskite structure).

The surface of BaTiO$_3$ observed with a scanning electronic microscope was extremely smooth. As a result of further observation of the surface of BaTiO$_3$ in the region 1×1 μm$^2$ with an interatomic force microscope, it was understood that the fourface has smoothness comparable to glass ground up optically. From this fact, the BaTiO$_3$ film having such a smooth surface may be expected to have a superior and low light-attenuation property as an optical waveguide. As a result of measuring the polarization of BaTiO$_3$ in the capacitor structure of Cr/2,000 angstrom-BaTiO$_3$/300 angstrom-SrTiO$_3$/200 angstrom-MgO/GaAs, the P-E property in this structure showed a hysteresis loop, and it was understood that BaTiO$_3$ was a ferroelectric phase (square crystal) in which the polarization axis was orientated perpendicularly to the single crystal GaAs substrate as had been inferred by the analysis of the structure.

EXAMPLE 2

The formation of an epitaxial MgO buffer layer onto Si was performed in the same manner as in the above Example 1. An n-type or p-type (100) plane 6×6 mm wafer was used as an Si substrate. Immediately after the substrate was etched by HF and was dried after solvent cleaning almost in the same manner as in the previous Example 1, the substrate was led into a deposition chamber, and was heated under the conditions of constant temperature, background pressure 3×10$^{-7}$ Torr, and not less than 500° C. in order to dissociate (sublimate) an H-passivation layer on the Si surface. Subsequently, MgO was formed into a film of about 300 angstrom under the conditions of 200° to 600° C., and 1×10$^{-6}$ to 1×10$^{-3}$ Torr O$_2$, thereby obtaining an epitaxial thin film in which the relationship of intra-surface crystal orientation between MgO and Si was expressed by MgO (100)//Si (100), and MgO [001]//Si [001]. Further, under the conditions of 600° to 800° C., and 1×10$^{-4}$ to 1×10$^{-2}$ Torr O$_2$, SrTiO$_2$ of film thickness 200 to 1,000 angstrom was grown up on the MgO buffer layer, thereby obtaining the relationship of crystal orientation of SrTiO$_3$ (100)//MgO (100)//Si (100), and SrTiO$_3$ [001]//MgO [001]//Si [001].

Next, under the conditions of 600° to 800° C., and 1×10$^{-4}$ to 1×10$^{-2}$ Torr O$_2$, PbTiO$_3$ of film thickness 1,000 to 2,000 angstrom grown up on the SrTiO$_3$/MgO buffer layer showed c-axis orientation growth. The relationship of crystal orientation between PbTiO$_3$ and SrTiO$_3$/MgO/Si identified by X-ray diffraction pattern was PbTiO$_3$ (001)//SrTiO$_3$ (100)//MgO (100)//Si (100), and PbTiO$_3$ [010]//SrTiO$_3$ [001]//MgO [001]//Si [001].

The surface of PbTiO$_3$ observed with a scanning electronic microscope was extremely smooth enough to be expected to have a superior and low light-attenuation property as an optical waveguide.

Pb$_{1-x}$La$_x$(Zr$_{1-y}$Ti$_y$)$_{1-x/4}$O$_3$ (PLZT), where x=0.07 and y=0.65, could be also epitaxially grown up onto Si by use of an epitaxial MgO buffer layer in the same manner. Further, even if x and y were changed within the range of 0≦x,y≦1, PLZT could be also epitaxially grown up onto Si by use of an epitaxial MgO buffer layer. It is sufficient if a buffer layer perovskite ABO$_3$ type thin film has a lattice constant closer to the a-axis of an upper layer perovskite ABO$_3$ type ferroelectric thin film than to the c-axis. Further, although ABO$_3$ (001)//SrTiO$_3$ (100)//MgO (100)//semiconductor (100) and ABO$_3$ [010]//SrTiO$_3$ [001]//MgO [001]//semiconductor [001] was obtained as the relationship of crystal orientation in the above example, the relationship of crystal orientation is not limited in this, and it is sufficient if the relationship of crystal orientation satisfies the epitaxy or orientation of ABO$_3$ (001)//ABO$_3$ (100)//MgO (100)//semiconductor (100).

Further, although excimer laser deposition was used in this embodiment, the process of forming a film is not limited to this, and a wet process such as a sol-gel process, and a vapor phase growth process selected from Rf-magnetron sputtering, ion beam sputtering, electron beam evaporation, flash evaporation, ion plating, molecular beam epitaxy (MBE), ionized cluster beam epitaxy, chemical vapor phase growth (CVD), organo-metal chemical vapor phase growth (MOCVD), plasma CVD, or the like, are effective to produce the structure of the present invention in the same manner.

In the first embodiment, an epitaxial or orientative buffer layer having a double-layer structure, for example, consisting of an MgO thin film and a perovskite ABO$_3$ type thin film, is provided on a single crystal semiconductor (100) substrate, so that a perovskite ABO$_3$ type ferroelectric thin film formed thereon becomes an epitaxial or orientative ferroelectric thin film of c-axis orientation. It is therefore possible to use it as a high function non-volatile memory or capacitor, or an FET element. Further, it is possible to confine semiconductor laser light in a ferroelectric thin film optical waveguide by means of an MgO layer having a refractive index smaller than a ferroelectric substance, so that according to the present invention, it is possible to make up an optical modulation element on a GaAs group semiconductor substrate or produce an optical integrated circuit on an Si semiconductor integrated circuit.

A second embodiment of the present invention will now be described.

An orientive ferroelectric thin film according to the second embodiment is characterized in that an epitaxial MgO buffer layer is formed on a single crystal Si (100) substrate, and an epitaxial or orientative perovskite ABO$_3$ type ferroelectric thin film is further formed thereon.

The crystallographic relationship in an orientative ferroelectric thin film according to the second embodiment, for example, using BaTiO$_3$, is expressed by BaTiO$_3$ (001)//MgO (100)//Si (100), and intra-surface orientation BaTiO$_3$ [010]//MgO [001]//Si [001], and it is possible to make such a structure in which the direction of polarization of a ferroelectric substance of square crystal system is perpendicular to the surface of the substrate.

The crystallographic relationship between MgO and Si is expressed by MgO (100)//Si (100) in crystal orientation, and MgO [001]//Si [001] in intra-surface orientation in spite of the lattice mismatching degree of 22.5%. According to the observation of the interface between MgO and Si by use of a high resolution transmission-type electronic microscope, a structure to be considered as lattice matching of MgO:Si= 4:3 is formed, and it is confirmed that the interface has no production of SiO$_2$ or the like and is a sharp boundary. Considering the lattice matching of 4:3, the lattice mismatching degree is 3.4%, which is smaller than the lattice mismatching of 9.7% in the case of the epitaxial growth of MgO (100)//Si (100), and MgO [011]//Si [001]. The stress in the film is more relaxed than in the case of MgO [011]//Si [001], so that the epitaxial thin film of MgO [001]//Si [001] becomes superior in spite of such a large degree of lattice mismatching in appearance.

Therefore, in the case of epitaxially growing up a ferroelectric compound on a substrate in which $MgAl_2O_4$ (100) or MgO (100) has been grown up epitaxially on an Si (100) single crystal, the relationship of intra-surface crystal orientation between MgO and Si in MgO (100)//Si (100) is preferably made not MgO [011]//Si [001], but MgO [001]//Si [001].

In the second embodiment of the present invention, an epitaxial MgO buffer layer is formed on a single crystal Si (100) substrate, thereby enabling an epitaxial or orientative perovskite $ABO_3$ type ferroelectric thin film to be formed thereon. Specifically, there is formed an orientative perovskite $ABO_3$ type ferroelectric thin film of $BaTiO_3$, $PbTiO_3$, $Pb_{1-x}La_x(Zr_yTi_{1-y})_{1-x/4}O_3$ (PLZT), $LiNbO_3$, $KNbO_3$, $Bi_4Ti_3O_{12}$, or the like. As a production method thereof, it is possible and effective to use a vapor phase growth process such as excimer laser deposition, Rf-magnetron sputtering, ion beam sputtering, electron beam evaporation, flash evaporation, ion plating, molecular beam epitaxy (MBE), chemical vapor phase growth (CVD), organo-metal chemical vapor phase growth (MOCVD), or the like.

In the second embodiment, preferably, the crystallographic relationship between the above-mentioned single crystal Si (100) substrate and the epitaxial MgO buffer layer is expressed by MgO (100)//Si (100), and MgO [001]//Si [001] in intra-surface orientation. Further, preferably, the crystallographic relationship between the epitaxial MgO buffer layer and the epitaxial or orientative perovskite $ABO_3$ type ferroelectric thin film is expressed by $ABO_3$ (001)//MgO (100) or $ABO_3$ (100)//MgO (100), and $ABO_3$ [010]//MgO [001] or $ABO_3$ [001]//MgO [001] in intra-surface orientation.

An orientative ferroelectric thin film according to the second embodiment has the above-mentioned structure, so that it is possible to realize the epitaxial growth of a perovskite $ABO_3$ type ferroelectric thin film on a single crystal Si (100) substrate. That is, an epitaxial MgO buffer layer helps the epitaxial growth of the ferroelectric thin film, and acts as a diffusion barrier. At this time, it is considered that the lattice matching of 4:3 is formed in the interface of MgO-Si having the lattice mismatching degree 3.4% which is smaller than the lattice mismatching 9.7% in the case of the epitaxial growth of MgO (100)//Si (100), and MgO [011]//Si [001]. Although it has a large degree of lattice mismatching 22.5% in appearance, the stress in the film is more relaxed than in the case of MgO [011]//Si [001], so that the superior epitaxial grow of MgO [001]//Si [001] becomes possible.

Further, since the orientation of a ferroelectric thin film can be controlled, it is possible to obtain a large value of residual polarization or a large electro-optic constant, and in an FET element in which an insulator is formed between a ferroelectric substance and a semiconductor, it is possible to prevent charges from being injected from the semiconductor at the time of the polarization of the ferroelectric substance, so that it is easy to maintain the polarization state of the ferroelectric substance. Further, although the refractive index of a ferroelectric substance is generally smaller than that of Si, if a buffer layer has a smaller refractive index than the ferroelectric substance, it becomes possible to confine laser light in a ferroelectric thin film optical waveguide, and it is possible to make up an optical integrated circuit on an Si semiconductor integrated circuit.

Specific examples of the second embodiment will now be described.

EXAMPLE 3

The formation of an epitaxial MgO buffer layer onto a single crystal Si substrate was performed by excimer laser deposition in which a target surface is momentarily heated by UV laser pulses to perform deposition. A XeCl excimer laser (wavelength 308 nm) was used under the condition of pulse cycle 4 Hz, pulse length 17 ns, and energy 130 mJ (energy density on the target surface 1.3 J/cm$^2$). The distance between the target and the substrate was 50 mm. Metal Mg was used as the target since MgO has no absorption in wavelength 308 nm. Mg is easily oxidized by leading $O_2$ into a film since MgO has a high bond energy not less than 10 eV. The Si substrate was heated by a halogen lamp.

A 6×6 mm wafer of n-type or p-type and (100) plane was used as the single crystal Si substrate. The substrate was etched in an HF group solution after solvent cleaning. This substrate was further rinsed with deionized water and ethanol, and was finally spin-dried with ethanol under the flow of nitrogen. The substrate was led into a deposition chamber immediately after spin-drying, and was heated at a constant temperature under background pressure $3\times10^{-7}$ Torr and temperature not less than 500° C. in order to dissociate (sublimate) an H-passivation layer on the Si surface, and then the formation of a film of MgO of 40 to 300 angstrom was performed under the condition of 200° to 700° C., and $1\times10^{-5}$ to $1\times10^{-3}$ Torr $O_2$.

Analyzed by X-ray diffraction, MgO formed into a film on the Si substrate was an epitaxial film of (100) plane single orientation under a broad condition, and particularly a superior thin film was obtained under the condition of 400° to 600° C., and $2\times10^{-6}$ to $1\times10^{-5}$ Torr $O_2$. X-ray diffraction phi scanning was performed in order to identify the relationship of intra-surface crystal orientation between MgO and Si. The phi scanning on (202) plane having an angle 45° with respect to (100) plane in cubic crystal showed a sharp peak having a revolution cycle of 90° with respect to MgO of MgO (100)/Si (100), and this position correspond to the peak position of Si. From this fact, it was understood that the crystallographic relationship between MgO and Si was expressed by MgO (100)//Si (100) in crystal orientation, and MgO [001]//Si [001] in intra-surface orientation in spite of the lattice mismatching degree of 22.5%.

According to the observation of the interface between MgO and Si by use of a high resolution transmission-type electronic microscope, such a structure as could be regarded as MgO:Si=about 4:3 was formed, and the interface had no production of $SiO_2$ or the like and was a sharp boundary. Considering the lattice matching of 4:3, the lattice matching degree is 3.4% in the case of MgO:Si=4:3. It can be however considered that the stress in the film was relaxed so that such a superior epitaxial thin film of MgO [001]//Si [001] was obtained in spite of such a large degree of lattice mismatching.

On the other hand, $BaTiO_3$ (square crystal system, perovskite structure) of a typical ferroelectric substance and Si (cubic crystal system, diamond structure) are so different in lattice constant that the degree of lattice mismatching is 26.4%. However, when lattice matching is considered from the point of view of the intra-surface 45° revolution of BaTiO$_3$ (001) plane and Si (100) plane, that is, from the point of view of the relationship of orientation of BaTiO$_3$ [110]//Si [001], the degree of lattice mismatching is comparatively small such as 4.0%. Therefore, BaTiO$_3$ was grown up directly on GaAs. In forming a film, various O$_2$ pressure as mentioned above was set for the first 100 pulses, and then, the formation of the film was continued at 1.0 mTorr O$_2$. The crystallization of BaTiO$_3$ was changed depending on the O$_2$ pressure and film formation temperature for the first 100 pulses, but any obtained film was a polycrystal film of (110)/(101) orientation. As is apparent from the result, epitaxy was not decided on the degree of lattice matching simply.

Although epitaxy was not seen in the direct growth of BaTiO$_3$ on Si as described above, all BaTiO$_3$ of film thickness 500 to 2,000 angstrom grown up on an MgO buffer layer under the condition of 600° to 800° C. and $1\times10^{-4}$ to $1\times10^{-2}$ Torr O$_2$ showed epitaxial growth in spite of the degree of lattice mismatching 5.2% with respect to MgO. Analyzed in X-ray diffractive pattern, BaTiO$_3$ was orientative in c-axis, and the relationship of crystal orientation between BaTiO$_3$ and MgO/GaAs identified by phi scanning was BaTiO$_3$ (001)//MgO (100)//Si (100), and BaTiO$_3$ [010] //MgO [001]//Si [001].

Figure 4:
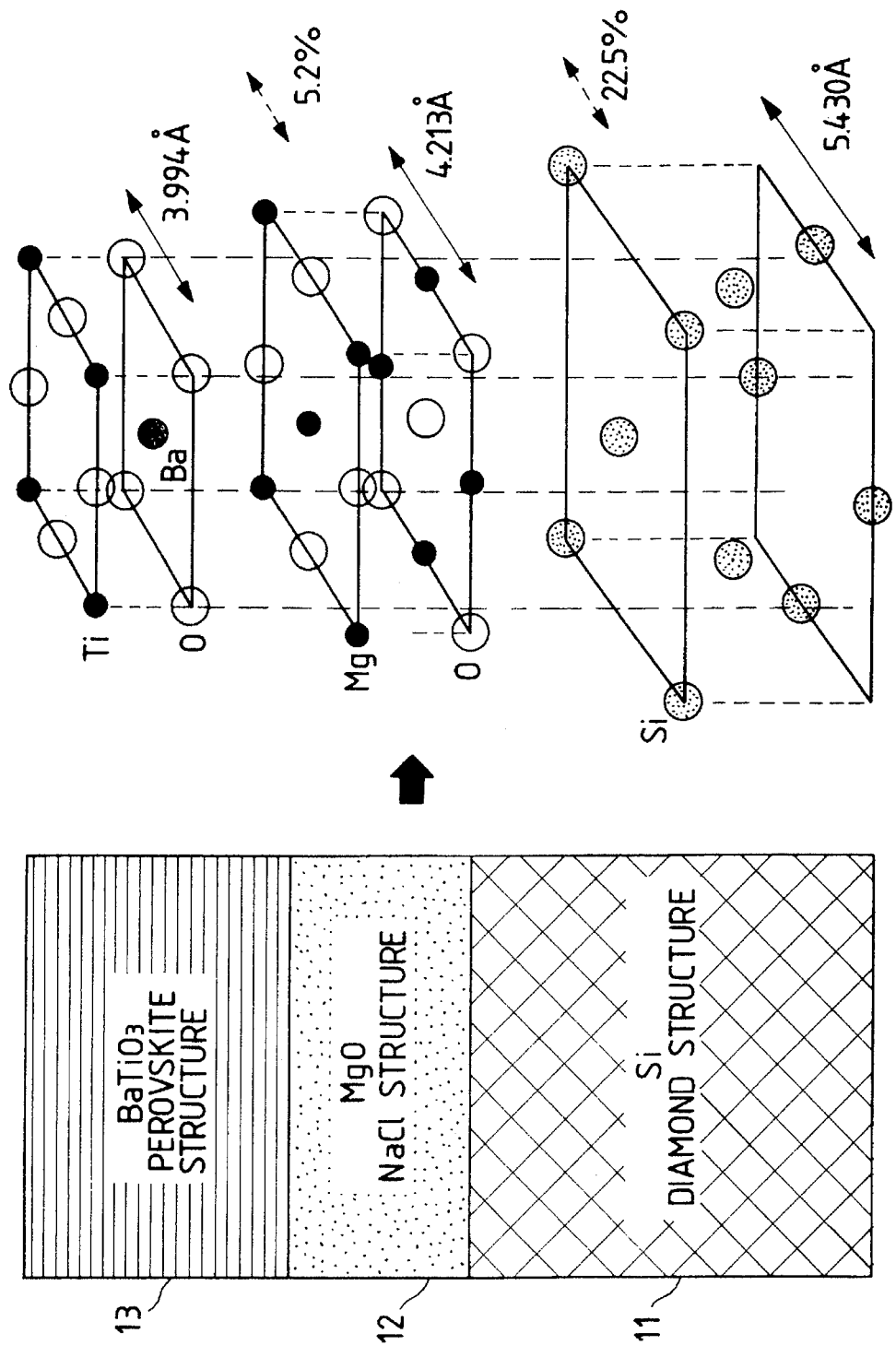
FIG. 4 is an explanatory diagram illustrating the relationship of crystal orientation of an epitaxial $BaTiO_3$ thin film and an MgO thin film to a single crystal Si substrate.

In FIG. 4, reference numeral 11 represents a single crystal Si substrate (diamond structure), 12 an MgO thin film (NaCl structure), and 13 an epitaxial BaTiO$_3$ thin film (perovskite structure).

The surface of BaTiO$_3$ observed with a scanning electronic microscope was extremely smooth. Further, according to the observation of the surface of BaTiO$_3$ in the region $1\times1$ μm$^2$ with an interatomic force microscope, the smoothness of the surface was comparable to glass (the surface roughness of 50 to 150 angstrom) ground up optically. From this fact, the BaTiO$_3$ film having such a smooth surface can be expected to have a superior and low light-attenuation property as an optical waveguide. As the result of measuring the polarization of BaTiO$_3$ in the capacitor structure of Cr/2,000 angstrom-BaTiO$_3$/400 angstrom-MgO/Si, the P-E property in this structure showed a hysteresis loop, and it was understood that BaTiO$_3$ was a ferroelectric phase (square crystal) in which the polarization axis was orientated perpendicularly to the single crystal Si substrate as had been inferred by the analysis of the structure.

EXAMPLE 4

The formation of an epitaxial MgO buffer layer onto Si was performed in the same manner as in the above Example 3. A 6×6 mm wafer of n-type or p-type and (100) plane was used as an Si substrate. Immediately after the substrate was etched, rinsed and dried in the same manner as in Example 3, the substrate was led into a deposition chamber, and was heated under the condition of constant temperature, background pressure $3\times10^{-7}$ Torr, and not less than 500° C. in order to dissociate (sublimate) an H-passivation layer on the Si surface. Subsequently, MgO was formed into a film of about 300 angstrom under the condition of 200° to 600° C., and $1\times10^{-6}$ to $1\times10^{-3}$ Torr O$_2$, thereby obtaining an epitaxial thin film in which the relationship of intra-surface crystal orientation between MgO and Si was expressed by MgO (100)//Si (100), and MgO [001]//Si [001].

PbTiO$_3$ of film thickness 1,000 to 2,000 angstrom was grown up on the MgO buffer layer under the condition of 600° to 800° C., and $1\times10^{-4}$ to $1\times10^{-2}$ Torr O$_2$, which shows a-axis orientation growth. The relationship of crystal orientation between BaTiO$_3$ and MgO/GaAs identified by X-ray diffractive pattern was PbTiO$_3$ (100)//MgO (100)//Si (100).

The surface of PbTiO$_3$ observed with a scanning electronic microscope was extremely smooth enough to be expected to have a superior and low light-attenuation property as an optical waveguide.

Pb$_{1-x}$La$_x$(Zr$_{1-y}$Ti$_y$)$_{1-z/4}$O$_3$ (PLZT), where x=0.07 and y=0.65, could be also epitaxially grown up onto Si by use of an epitaxial MgO buffer layer in the same manner. Further, even if x and y were changed within the range of $0 \leq x, y \leq 1$, PLZT could be also epitaxially grown up onto Si by use of an epitaxial MgO buffer layer.

Further, although excimer laser deposition was used in this embodiment, the process of forming a film is not limited to this, and a vapor phase growth process such as Rf-magnetron sputtering, ion beam sputtering, electron beam evaporation, flash evaporation, ion plating, molecular beam epitaxy (MBE), ionized cluster beam epitaxy, chemical vapor phase growth (CVD), organo-metal chemical vapor phase growth (MOCVD), plasma CVD, or the like, is effective to produce the structure of the present invention in the same manner.

According to the second embodiment of the present invention, a ferroelectric thin film can be grown up epitaxially on a single crystal Si (100) substrate which is more inexpensive than a conventionally used single crystal oxide substrate. An orientative ferroelectric thin film according to the second embodiment of the present invention is therefore suitable for making up a non-volatile memory, a capacitor, an FET element or the like, and is available for producing an element such as an optical integrated circuit on an Si semiconductor integrated circuit.

What is claimed is:

1. An oriented ferroelectric thin film, comprising:

a semiconductor single crystal (100) substrate;

an epitaxial or oriented buffer layer formed on said semiconductor single crystal (100) substrate wherein said epitaxial or oriented buffer layer has a structure in which a buffer thin film having a perovskite ABO$_3$ structure is formed on an MgO thin film; and an epitaxial or oriented ferroelectric thin film having a perovskite ABO$_3$ structure formed on said buffer thin film of said buffer layer, wherein said ferroelectric thin film is a different material than said buffer thin film.

2. An oriented ferroelectric thin film according to claim 1, wherein said epitaxial or oriented ferroelectric thin film having a perovskite ABO$_3$ structure consists essentially of one member selected from the group consisting of BaTiO$_3$, PbTiO$_3$, Pb$_{1-x}$La$_x$(Zr$_{1-y}$Ti$_y$)$_{1-(x/4)}$O$_3$ where $0 \leq x, y \leq 1$, LiNbO$_3$, KNbO$_3$, and Bi$_4$Ti$_3$O$_{12}$.

3. An oriented ferroelectric thin film according to claim 1, wherein said buffer thin film having a perovskite ABO$_3$ structure consists essentially of SrTiO$_3$.

4. An oriented ferroelectric thin film according to claim 1, wherein said buffer thin film having a perovskite ABO$_3$ structure of said epitaxial or oriented buffer layer has a lattice constant closer to an a-axis of said ferroelectric thin film having a perovskite ABO$_3$ structure than to a c-axis of said ferroelectric thin film having a perovskite ABO$_3$ structure.

5. An oriented ferroelectric thin film according to claim 1, wherein a crystallographic relationship among said single crystal substrate, said buffer layer and said ferroelectric thin film having a perovskite ABO$_3$ structure is expressed by ABO$_3$ (001)//ABO$_3$ (100)//MgO (100)// semiconductor single crystal (100).

6. An oriented ferroelectric thin film, comprising:

a single crystal Si (100) substrate;

an epitaxial MgO (100) buffer layer formed on said single crystal Si (100) substrate; and an epitaxial or oriented ferroelectric thin film having a perovskite $ABO_3$ (001) structure formed on said buffer layer.

7. An oriented ferroelectric thin film according to claim 6, wherein said epitaxial or oriented ferroelectric thin film having a perovskite $ABO_3$ structure consists essentially of a member selected from the group consisting of $BaTiO_3$, $PbTiO_3$, $Pb_{1-x}La_x(Zr_{1-y}Ti_y)_{1-(x/4)}O_3$ where $0 \leq x,y \leq 1$, $LiNbO_3$, $KNbO_3$, and $Bi_4Ti_3O_{12}$.

8. An oriented ferroelectric thin film according to claim 6, wherein crystallographic relationship between said single crystal Si (100) substrate and said epitaxial MgO buffer layer is expressed by MgO [001]//Si [001] in intra-surface orientation.

9. An oriented ferroelectric thin film, comprising:

a single crystal Si (100) substrate;

an epitaxial MgO buffer layer formed on said single crystal Si (100) substrate; and an epitaxial or oriented ferroelectric thin film having a perovskite $ABO_3$ structure formed on said buffer layer wherein a crystallographic relationship between said epitaxial MgO buffer layer and said epitaxial or oriented ferroelectric thin film having a perovskite $ABO_3$ structure is expressed by $ABO_3$ (001)//MgO (100) or $ABO_3$ (100)//MgO (100), and $ABO_3$ (010)//MgO (001), or $ABO_3$ (001)//MgO (001) in intra-surface orientation.

\* \* \* \* \*

UNITED STATES PATENT AND TRADEMARK OFFICE
CERTIFICATE OF CORRECTION

PATENT NO. : 5,514,484
DATED : May 07, 1996
INVENTOR(S) : Keiichi NASHIMOTO

It is certified that error appears in the above-indentified patent and that said Letters Patent is hereby corrected as shown below:

Title page, item [57], line 10, "opitaxial" should read --epitaxial--.

Claim 2, column 12, line 51, "LiNbo$_3$" should read --LiNbO$_3$--.

Claim 7, column 13, line 13, "LiNbo$_3$" should read --LiNbO$_3$--.

Signed and Sealed this

Twenty-sixth Day of November 1996

Attest:

BRUCE LEHMAN

*Attesting Officer*      *Commissioner of Patents and Trademarks*